(12) United States Patent
Kim

(10) Patent No.: US 8,879,336 B2
(45) Date of Patent: Nov. 4, 2014

(54) SEMICONDUCTOR MEMORY DEVICE AND OPERATION METHOD THEREOF

(75) Inventor: Jee Yul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 127 days.

(21) Appl. No.: 13/605,854

(22) Filed: Sep. 6, 2012

(65) Prior Publication Data
US 2013/0107639 A1    May 2, 2013

(30) Foreign Application Priority Data

Oct. 27, 2011    (KR) .................. 10-2011-0110612

(51) Int. Cl.
*G11C 7/00*    (2006.01)
*G11C 7/02*    (2006.01)
*G11C 7/10*    (2006.01)

(52) U.S. Cl.
CPC ............... *G11C 7/02* (2013.01); *G11C 7/1006* (2013.01); *G11C 7/1012* (2013.01); *G11C 7/1039* (2013.01)
USPC ............ 365/189.05; 365/189.15; 365/189.16

(58) Field of Classification Search
CPC .. G11C 7/1006; G11C 7/1078; G11C 7/1096; G11C 7/02; G11C 7/1039; G11C 11/5642; G11C 16/06; G11C 16/10; G11C 16/0483
USPC ........................... 365/189.05, 189.15, 189.16
See application file for complete search history.

(56) References Cited

U.S. PATENT DOCUMENTS

| 7,885,112 B2* | 2/2011 | Li et al. ................... 365/185.12 |
| 2009/0172266 A1 | 7/2009 | Kimura |
| 2012/0166714 A1* | 6/2012 | Mun et al. .................... 711/103 |
| 2013/0083619 A1* | 4/2013 | Jeon et al. ............... 365/230.08 |
| 2013/0163332 A1* | 6/2013 | Cha .......................... 365/185.12 |

FOREIGN PATENT DOCUMENTS

KR    1020100111990    10/2010

OTHER PUBLICATIONS

Preliminary Rejection issued by the Korean Intellectual Property Office on Feb. 7, 2013.

* cited by examiner

*Primary Examiner* — Tan T. Nguyen
(74) *Attorney, Agent, or Firm* — IP & T Group LLP

(57) ABSTRACT

A semiconductor memory device includes a memory cell block including memory cells, a random value generation circuit configured to generate random value data using a page address and a column address, a page buffer section connected to bit lines of the memory cell block and configured to store input data inputted in response to the column address and the random value data, and a controller configured to control the page buffer section to generate random data by performing a logic operation on the input data and the random value data stored in the page buffer section.

19 Claims, 4 Drawing Sheets

SEMICONDUCTOR MEMORY DEVICE AND OPERATION METHOD THEREOF

CROSS-REFERENCE TO RELATED APPLICATION

This application claims priority from Korean Patent Application No. 10-2011-0110612, filed on Oct. 27, 2011, the contents of which are incorporated herein by reference in its entirety.

BACKGROUND

The present invention relates to a semiconductor memory device and an operation method thereof, more particularly, to a semiconductor memory device for randomizing data inputted from the outside and programming the randomized data and an operation method thereof.

In case that data is stored with specific distribution in a memory cell array in a program operation of a semiconductor memory device, reliability of the data may be deteriorated because interference between memory cells included in the memory cell array increases. Particularly, when the same data is stored concentrically in memory cells included in specific part of the memory cell array, potential difference may occur internally in the memory cell array and so data may be changed. To prevent the occurrence of this phenomenon, program data inputted from a host is randomized and the randomized data is programmed to the memory cell array.

The program data inputted through an input/output circuit is randomized, and then the randomized program data is inputted to a page buffer. Accordingly, in case that the program operation is performed by using the randomized program data, the program data inputted from a host is programmed randomly in the memory cell array. A read operation restores the randomized programmed data into original program data in reverse order of the randomizing steps performed in the program operation.

FIG. 1 is a block diagram illustrating a conventional semiconductor memory device.

In FIG. 1, a semiconductor memory device 10 includes an IO buffer 11, a random circuit 12, a column decoder 13, a page buffer section 14 and a memory cell array 15.

Input data inputted from the outside host through the IO buffer 11 is scrambled and outputted as random data by the random circuit 12 when a program operation is performed. The random data is stored in the page buffer section 14 through the column decoder 13, and the random data stored in the page buffer section 14 is programmed in the memory cell array 15.

The page buffer section 14 senses the data stored in the memory cell array in the read operation and stores temporarily the sensed data as read data. The column decoder 13 transmits the read data stored in the page buffer section 14 to the random circuit 12, and the random circuit 12 descrambles the read data in reverse order of steps in the scrambling operation. The descrambled data is outputted to the outside host through the IO buffer 11.

In the above conventional method, the data is to be randomized by the random circuit 12 when it is inputted through the IO buffer 11. However, margin for data input operation reduces due to a time for randomization operation according as operation speed of the semiconductor memory device increases.

In addition, in case that a partial data input operation of inputting data smaller than data capacity storable in one page of the memory cell array is performed, data "1" is assigned automatically and programmed in memory cells where the inputted data is not assigned in the page. In a read operation of the conventional method, even the data in the memory cells where the inputted data is not assigned may be restored into original data and outputted.

Furthermore, the host does not perform an operation of amending a part of data without outputting the data and storing the amended data in another memory block or another page when a copyback operation is performed. This is because the randomized data is generated through the randomization operation using the block address and the page address. That is, the randomized data may not be restored into original data if the block address and page address are changed.

SUMMARY OF THE INVENTION

Exemplary embodiments of the present invention provide a semiconductor memory device for storing external data inputted from the outside and random value data generated from a random value generation circuit in each of latches in a page buffer section, generating random data by performing a logic operation on the external data and the random value data and programming the generated random data in a memory cell block, and an operation method thereof.

A semiconductor memory device according to one embodiment of the present invention includes a memory cell block including memory cells; a random value generation circuit configured to generate random value data using a column address; and a page buffer section connected to bit lines of the memory cell block and configured to store input data inputted in response to the column address and the generated random value data.

A semiconductor memory device according to another embodiment of the present invention includes a memory cell block including memory cells; a random value generation circuit configured to generate random value data using a column address; page buffer groups configured to correspond to respective bit line groups of the memory cell block and store input data inputted in response to the column address and the random value data; and a controller configured to control the page buffer groups to generate random data by performing a logic operation on the input data and the random value data stored in the page buffer groups.

A method of operating a semiconductor memory device according to one embodiment of the present invention includes generating random value data in response to a column address; generating random data by performing a logic operation on the random value data and an input data inputted in response to the column address; and programming the random data to a memory cell block.

A method of operating a semiconductor memory device according to another embodiment of the present invention includes inputting program data to a first latch of a page buffer; storing the program data inputted to the first latch in a second latch of the page buffer and storing inverted data of the program data inputted to the first latch in a third latch of the page buffer; storing random value data generated in response to a column address of the program data in the first latch; performing XOR operation on the program data and the random value data and storing data obtained by the XOR operation in the third latch; and performing a program operation using the data stored in the third latch.

In one embodiment of the present invention, external data inputted from the outside and random value data generated from a random value generation circuit are stored in each of latches in a page buffer section, and then random data is generated by performing a logic operation on the stored external data and the stored random value data. As a result, the speed of generating the random data is enhanced, a randomization operation is improved in a partial data input operation, and limitation of the copyback is removed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be described in more detail with reference to the accompanying drawings. Although the present invention is described with reference to the specific embodiments thereof, it will be apparent to those skilled in the art that various changes and modifications may be made without departing from the spirit and scope of the present invention.

Figure 1:
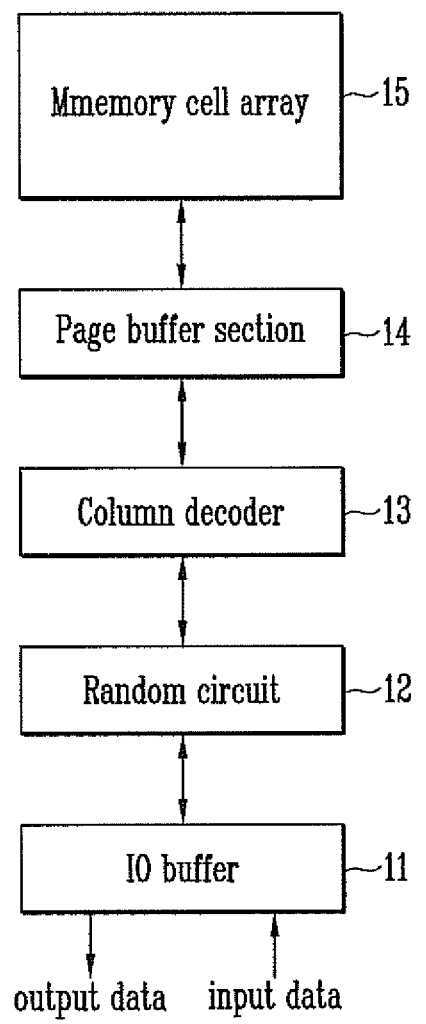
FIG. 1 is a block diagram illustrating a conventional semiconductor memory device.
Figure 2:
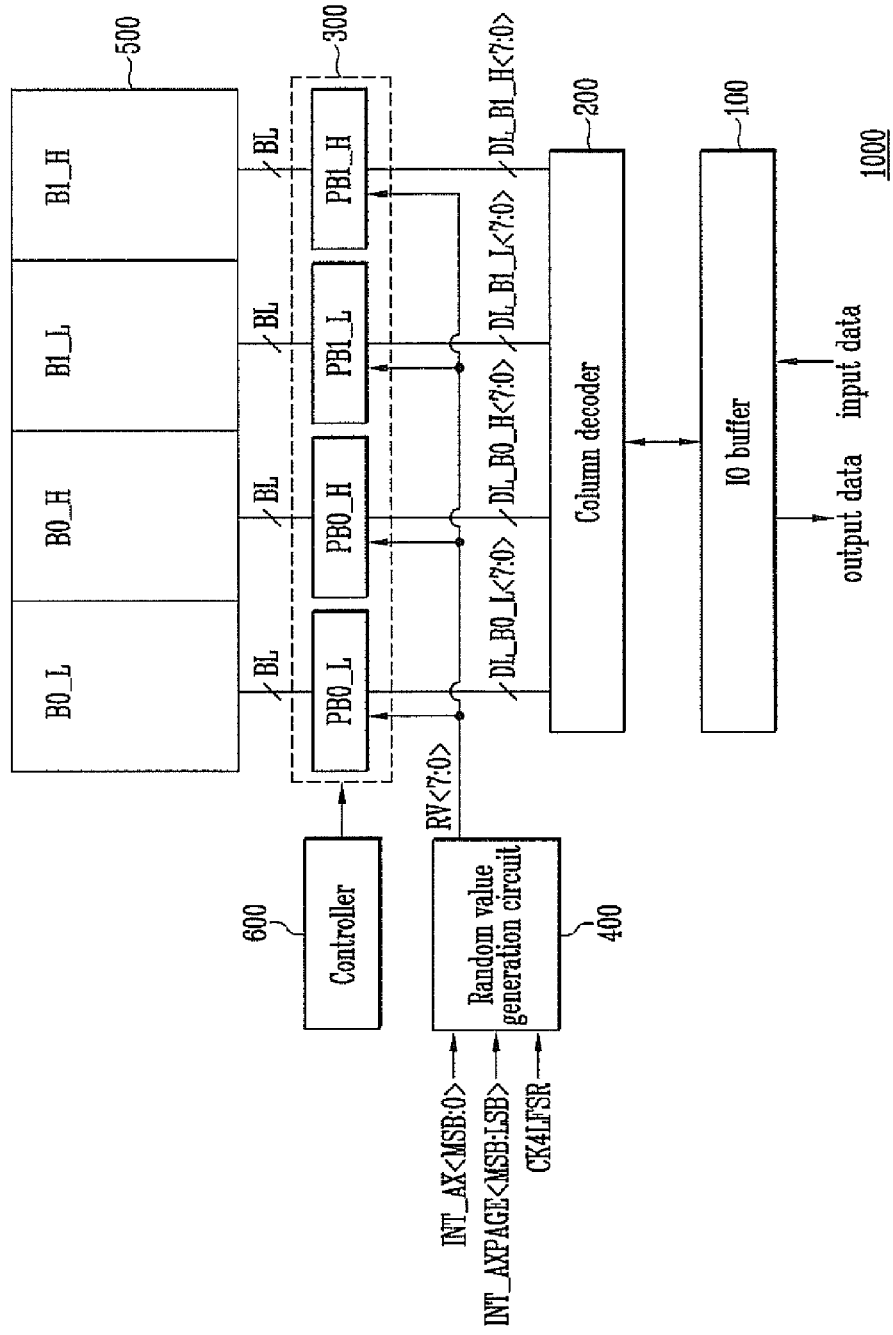
FIG. 2 is a block diagram illustrating a semiconductor memory device according to one exemplary embodiment of the present invention.

In FIG. 2, a semiconductor memory device 1000 includes an IO buffer 100, a column decoder 200, a page buffer section 300, a random value generation circuit 400, a memory block 500 and a controller 600.

The IO buffer 100 receives input data from the outside when a data input operation is performed and outputs the received input data to the column decoder 200. The IO buffer 100 outputs read data (output data) transmitted from the column decoder 200 to the outside when a read operation of data is performed.

The column decoder 200 outputs the input data transmitted from the IO buffer 100 in the data input operation to the page buffer section 300 through data line groups DL_B0_L<7:0>, DL_B0_H<7:0>, DL_B1_L<7:0>, and DL_B1_H<7:0> corresponding to column addresses. The column decoder 200 outputs the read data transmitted from the page buffer section 300 to the IO buffer 100 when the read operation of data is performed.

The page buffer section 300 includes page buffer groups PB0_L, PB0_H, PB1_L, and PB1_H. The page buffer groups PB0_L, PB0_H, PB1_L, and PB1_H correspond to the data line groups DL_B0_L<7:0>, DL_B0_H<7:0>, DL_B1_L<7:0>, and DL_B1_H<7:0>, respectively. In addition, each of the page buffer groups PB0_L, PB0_H, PB1_L, and PB1_H includes page buffers.

Each of the page buffers in the page buffer group PB0_L, PB0_H, PB1_L, and PB0_H stores temporarily the input data transmitted through the corresponding data line groups DL_B0_L<7:0>, DL_B0_H<7:0>, DL_B1_L<7:0>, and DL_B1_H<7:0> in the data input operation of a normal mode, and then changes potential of a connected bit line depending on the input data. Additionally, each of the page buffers in the page buffer groups PB0_L, PB0_H, PB1_L, and PB1_H senses potential of the connected bit line in a data output operation of the normal mode, and outputs the sensed potential as the read data.

In the data input operation of a random mode, each of page buffers in the page buffer groups PB0_L, PB0_H, PB0_L, and PB1_H stores temporarily the input data transmitted from the corresponding data line groups DL_B0_L<7:0>, DL_B0_H<7:0>, DL_B1_L<7:0>, and DL_B1_H<7:0> and random value data (one of RV<7:0>) outputted from the random value generation circuit 400, and generates random data by performing a logic operation on the stored input data and the stored random value data. The random value data is determined by selecting randomly '0' or '1'. The generated random data is stored in the page buffer as program data and potential of the connected bit line is changed depending on the program data. Furthermore, each of the page buffers in the page buffer groups PB0_L, PB0_H, PB0_L, and PB0_H stores temporarily sensing data generated by sensing potential of the connected bit line and random value data (one of RV<7:0>) outputted from the random value generation circuit 400, and generates read data by performing a logic operation on the stored sensing data and the stored random value data in the data output operation of the random mode. It is desirable that the logic operation of generating the read data is performed in reverse order of the logic operation of generating the random data.

The random value generation circuit 400 outputs the random value data RV<7:0> in response to a page address INT_AXPAGE<MSB:LSB>, a column address INT_AX<0:MSB> and a count clock signal CK4LFSR in the data input operation and the data output operation. The random value generation circuit 400 generates and outputs the random value data when an operation of amending a part of data of a target page and storing the amended data in a page of another memory block or another page of the same memory block in a copyback operation is performed. The count clock signal CK4LFSR is a clock signal to have constant period when the data input operation, the data output operation and the randomization operation of the copyback operation are performed.

The memory cell block 500 includes plural strings (not shown) where memory cells are connected in serial to a bit line. The memory cell array 500 is divided into blocks B0_H, B0_L, B1_H, and B1_L, and each of the blocks has the strings. The blocks share word lines, and memory cells connected to the same word line correspond to the same page.

The controller 600 controls the page buffer section 300 to generate the random data by using the input data and the random value data stored temporarily in the page buffer section 300 in the data input operation of the random mode. In addition, the controller 600 controls the page buffer section 300 to generate the read data in reverse order of the randomization operation using the sensing data and the random value data stored temporarily in the page buffer section 300 in the data output operation of the random mode.

Figure 3:
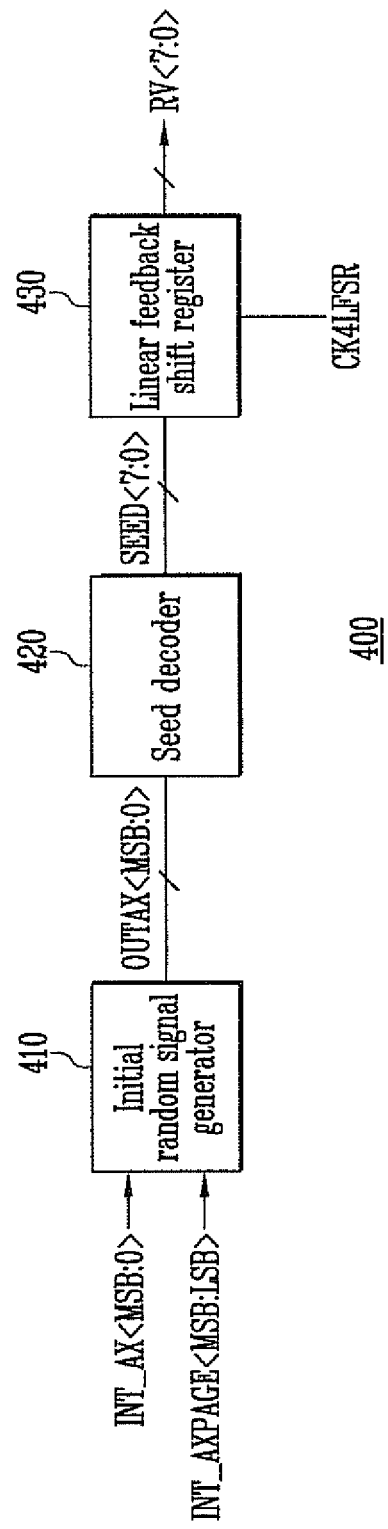
FIG. 3 is a view illustrating detailed circuitry of the random value generation circuit shown in FIG. 2.

FIG. 3 is a view illustrating detailed circuitry of the random value generation circuit in FIG. 2.

In FIG. 3, the random value generation circuit 400 includes an initial random signal generator 410, a seed decoder 420 and a linear feedback shift register 430.

The initial random signal generator 410 generates initial random value OUTAX<0:MSB> in response to the page address INTAXPAGE<MSB:LSB> and the column address INT_AX<0:MSB>. Since the initial random value OUTAX<0:MSB> is generated in response to the page address INT_AXPAGE<MSB:LSB> and the column address INT_AX<0:MSB>, the random value data has random characteristics in a direction of the word line and a direction of the bit line.

The seed decoder 420 generates a seed value SEED<7:0> by decoding the initial random value OUTAX<0:MSB> generated from the initial random signal generator 410.

The linear feedback shift register 430 generates the random value data RV<7:0> changed in response to the count clock signal CK4LFSR by using the seed value SEED<7:0> generated from the seed decoder 420.

Figure 4:
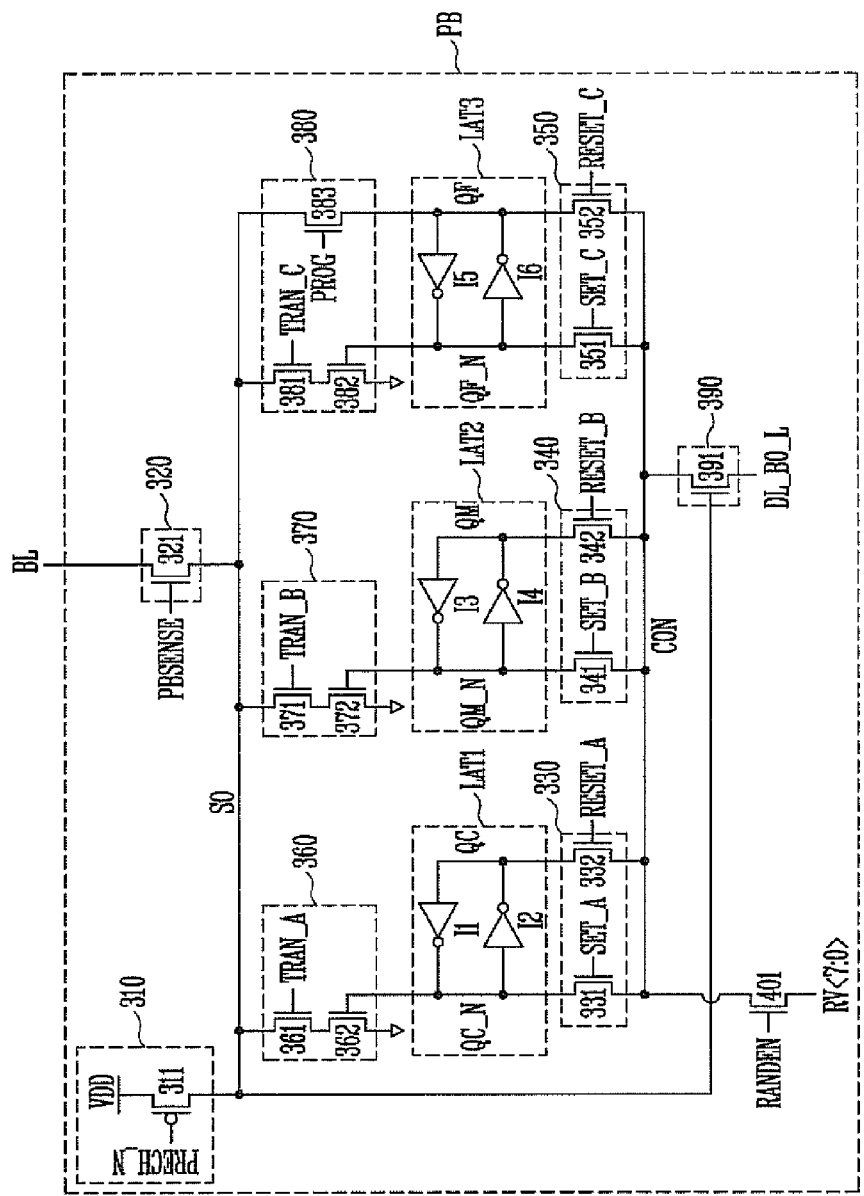
FIG. 4 is a view illustrating detailed constitution of one page buffer in the page buffer group shown in FIG. 2.

FIG. 4 is a view illustrating detailed constitution of one page buffer in the page buffer group PB0_H in FIG. 2.

The page buffer PB includes a precharge circuit 310, a sensing circuit 320, first to third latches LAT1, LAT2, and LAT3, first to third set/reset circuits 330, 340, and 350, first to third transmission circuits 360, 370, and 380, a discharge circuit 390, and a random switch 401.

The precharge circuit 310 precharges a sensing node SO by connecting a supply voltage terminal VDD to the sensing node SO in response to a precharge signal PRECH_N. The precharge circuit 310 includes a PMOS transistor 311 connected between the supply voltage terminal VDD and the sensing node SO and operating in response to the precharge signal PRECH_N.

The sensing circuit 320 connects the selected bit line BL to the sensing node SO in response to a sensing signal PBSENSE. The sensing circuit 320 includes an NMOS transistor 321 connected between the bit line BL and the sensing node SO and operating in response to the sensing signal PBSENSE.

The first latch LAT1 includes a first inverter I1 and a second inverter I2. An input terminal of the first inverter I1 is connected to an output terminal of the second inverter I2, and an output terminal of the first inverter I1 is connected to an input terminal of the second inverter I2. The input terminal of the first inverter I1 corresponds to a cache node QC, and the output terminal of the first inverter I1 corresponds to an inverse cache node QC_N.

The second latch LAT2 includes a third inverter I3 and a fourth inverter I4. An input terminal of the third inverter I3 is connected to an output terminal of the fourth inverter I4, and an output terminal of the third inverter I3 is connected to an input terminal of the fourth inverter I4. The input terminal of the third inverter I3 corresponds to a main node QM, and the output terminal of the third inverter I3 corresponds to an inverse main node QM_N.

The third latch LAT3 includes a fifth inverter I5 and a sixth inverter I6. An input terminal of the fifth inverter I5 is connected to an output terminal of the sixth inverter I6, and an output terminal of the fifth inverter I5 is connected to an input terminal of the sixth inverter I6. The input terminal of the fifth inverter I5 corresponds to a flag node QF, and the output terminal of the fifth inverter I5 corresponds to an inverse flag node QF_N.

The first set/reset circuit 330 transmits data inputted to the first latch LAT1 to a common node CON in response to a first set signal SET_A and a first reset signal RESET_A. The first set/reset signal 330 includes an NMOS transistor 331 for connecting the inverse cache node QC_N to the common node CON in response to the first set signal SET_A and an NMOS transistor 332 for connecting the cache node QC to the common node CON in response to the first reset signal RESET_A.

The second set/reset circuit 340 transmits data inputted to the second latch LAT2 to the common node CON in response to a second set signal SET_B and a second reset signal RESET_B. The second set/reset signal 340 includes an NMOS transistor 341 for connecting the inverse main node QM_N to the common node CON in response to the second set signal SET_B and an NMOS transistor 342 for connecting the main node QM to the common node CON in response to the second reset signal RESET_B.

The third set/reset circuit 350 transmits data inputted to the third latch LAT3 to the common node CON in response to a third set signal SET_C and a third reset signal RESET_C. The third set/reset signal 350 includes an NMOS transistor 351 for connecting the inverse flag node QF_N to the common node CON in response to the third set signal SET_C and an NMOS transistor 352 for connecting the flag node QF to the common node CON in response to the third reset signal RESET_C.

The first transmission circuit 360 maintains potential of the sensing node SO or discharges the sensing node SO depending on the data stored in the first latch LAT1. The first transmission circuit 360 includes a first switch 361 and a second switch 362 connected in serial between the sensing node SO and a ground terminal Vss. The first switch 361 has an NMOS transistor operating in response to a first transmission signal TRAN_A and connecting the sensing node SO to the second switch 362. The second switch 362 includes an NMOS transistor operating in response to data inputted to the inverse cache node QC_N and connecting the first switch 361 to the ground terminal Vss.

The second transmission circuit 370 maintains potential of the sensing node SO or discharges the sensing node SO depending on the data stored in the second latch LAT2. The second transmission circuit 370 includes a third switch 371 and a fourth switch 372 connected in serial between the sensing node SO and the ground terminal Vss. The third switch 371 has an NMOS transistor operating in response to a second transmission signal TRAN_B and connecting the sensing node SO to the fourth switch 372. The fourth switch 372 includes an NMOS transistor operating in response to data inputted to the inverse main node QM_N and connecting the third switch 371 to the ground terminal Vss.

The third transmission circuit 380 maintains potential of the sensing node SO or discharges the sensing node SO depending on the data stored in the third latch LAT3. The third transmission circuit 380 includes a fifth switch 381 and a sixth switch 382 connected in serial between the sensing node SO and the ground terminal Vss, and a seventh switch 383 connected between the sensing node SO and the third latch LAT3. The fifth switch 381 has an NMOS transistor operating in response to a third transmission signal TRAN_C and connecting the sensing node SO to the sixth switch 382. The sixth switch 382 includes an NMOS transistor operating in response to data inputted to the inverse flag node QF_N and connecting the fifth switch 381 to the ground terminal Vss. The seventh switch 383 is an NMOS transistor operating in response to an eighth transmission signal PROG and connecting the sensing node SO to the flag node QF.

The discharge circuit 390 discharges the common node CON depending on potential of the sensing node SO. The discharge circuit 390 includes an NMOS transistor 391 operating in response to the potential of the sensing node SO and connected between the common node CON and a data line DL_B0_L. The data line DL_B0_L may be selectively connected to the ground terminal Vss.

The random switch 401 is connected between a node to which the random value data RV<7:0> outputted from the random value generation circuit is inputted and the common node CON and transmits the random value data RV<7:0> to the page buffer in response to a random signal RANDEN. The random switch 401 includes an NMOS transistor.

The data input operation in the normal mode and the data input operation in the random mode according to the present invention will be described with reference to accompanying drawings FIG. 2 to FIG. 4.

1) The Data Input and Output Operation in the Normal Mode

In the data input operation of the normal mode, the IO buffer 100 receives the input data from the outside and transmits the received input data to the column decoder 200. The column decoder 200 outputs the input data transmitted from the IO buffer 100 to the page buffer section 300 through the data line groups DL_B0_L<7:0>, DL_B0_H<7:0>, DL_B1_L<7:0>, and DL_B1_H<7:0> corresponding to column addresses. Each of the page buffers in the page buffer groups PB0_L, PB0_H, PB1_L, and PB1_H stores temporarily the input data transmitted through the data line groups DL_B0_L<7:0>, DL_B0_H<7:0>, DL_B1_L<7:0>, and DL_B1_H<7:0> and then changes the potential of the connected bit line depending on the input data. Subsequently, each of the page buffers programs selected memory cells by applying a program voltage to a selected word line of the memory cell block 500.

Additionally, a read voltage is applied to the selected word line of the memory cell block 500 in the data output operation, and each of the page buffer groups PB0_L, PB0_H, PB1_L, and PB1_H senses the potential of corresponding bit lines, stores temporarily the sensed potential as the read data and then outputs the read data to the column decoder 200. The column decoder 200 outputs the read data transmitted from the page buffer section 300 in sequence to the IO buffer 100 in response to the column address.

2) The Data Input and Output Operation in the Random Mode

In the data input operation of the random mode, the IO buffer 100 receives the input data from the outside and outputs the received input data to the column decoder 200. The column decoder 200 outputs the input data transmitted from the IO buffer 100 to the page buffer section 300 through the data line groups DL_B0_L<7:0>, DL_B0_H<7:0>, DL_B1_L<7:0>, and DL_B1_H<7:0> corresponding to the column address.

Each of the page buffers in the page buffer groups PB0_L, PB0_H, PB1_L, and PB1_H stores temporarily the input data transmitted through the data line groups DL_B0_L<7:0>, DL_B0_H<7:0>, DL_B1_L<7:0>, and DL_B1_H<7:0>. Particularly, each of the page buffers in the page buffer groups PB0_L, PB0_H, PB1_L, and PB1_H connects the data line DL_B0_L to the common node CON by activating the discharge circuit 390 in response to the potential of the sensing node SO precharged to high level by the precharge circuit 310. Subsequently, the first reset signal RESET_A is provided with high level, and thus data is inputted to the first latch LAT1.

TABLE 1

| | Input data | RV | Cache node (first latch) | Main node (second latch) | Flag node (third latch) |
|---|---|---|---|---|---|
| case 1 | 0 | — | 0 | — | — |
| case 2 | 1 | — | 1 | — | — |

Referring to Table 1, '0' is stored in the cache node QC in case that the input data of '0' is inputted (case 1). '1' is stored in the cache node QC in case that the input data of '1' is inputted (case 2). Here, potential of the node in which the data '1' is stored is Vcc, and potential of the node in which the data '0' is stored is 0V.

TABLE 2

| | Input data | RV | Cache node (first latch) | Main node (second latch) | Flag node (third latch) |
|---|---|---|---|---|---|
| case 1 | 0 | — | 0 | 0 | 1 |
| case 2 | 1 | — | 1 | 1 | 0 |

The data stored in the first latch LAT1 is stored in the second latch LAT2 and inverse data of the data stored in the first latch LAT1 is stored in the third latch LAT3, by activating the first reset signal RESET_A, the second reset signal RESET_B and the third set signal SET_C. Accordingly, in case that the input data is '0' (case1), '0' is stored in the cache node QC and the main node QM, and '1' is stored in the flag node QF. In case that the input data is '1' (case 2), '1' is stored in the cache node QC and the main node QM, and '0' is stored in the flag node QF.

TABLE 3

| | Input data | RV | Cache node (first latch) | Main node (second latch) | Flag node (third latch) |
|---|---|---|---|---|---|
| case 1 | 0 | 0 | 1 | 0 | 1 |
| | | 1 | 0 | 0 | 1 |
| case 2 | 1 | 0 | 1 | 1 | 0 |
| | | 1 | 0 | 1 | 0 |

Referring to Table 3, the random value generation circuit 400 outputs the random value data (one of RV<7:0>) of '0' or '1'. When random value data (one of RV<7:0>) is outputted, the random signal RANDEN is activated to high level, and thus the random value data RV<7:0> controls potential of the common node CON. Subsequently, inverted random signal is stored in the cache node QC by activating the first set signal SET_A. In case that the input data is '0' and the random value data (one of RV<7:0>) is '0', data '1' is stored in the cache node QC, In case that the input data is '0' and the random value data (one of RV<7:0>) is '1', data '0' is stored in the cache node QC. In case that the input data is '1' and the random value data (one of RV<7:0>) is '0', data '1' is stored in the cache node QC. In case that the input data is '1' and the random value data (one of RV<7:0>) is '1', data '0' is stored in the cache node QC. Here, the data stored in the main node QM and the flag node QF is not changed. A time taken for inputting of the random value data RV<7:0> may reduce by inputting simultaneously the random data RV<7:0> to the page buffer groups PB0_L, PB0_H, PB1_L, and PB1_H.

TABLE 4

| | Input data | RV | Cache node (first latch) | Main node (second latch) | Flag node (third latch) | Sensing node |
|---|---|---|---|---|---|---|
| case 1 | 0 | 0 | 1 | 0 | 1 | 1 |
| | | 1 | 0 | 0 | 1 | 0 |
| case 2 | 1 | 0 | 1 | 1 | 0 | 1 |
| | | 1 | 0 | 1 | 0 | 0 |

Referring to Table 4, the sensing node SO is precharged by activating the precharge signal PRECH_N, and then the precharge signal PRECH_N is deactivated. The potential of the sensing node SO is changed depending on data stored in the first latch LAT1 when the first transmission signal TRAN_A is activated. That is, since the second switch 362 is turned off in case that the input data is '0' and data stored in the cache node QC of the first latch LAT1 is '1', the sensing node SO maintains high level when the first transmission signal TRAN_A is activated. Since the second switch 362 is turned on in case that the input data is '0' and the data stored in the cache node QC of the first latch LAT1 is '0', potential of the sensing node SO is changed to low level when the first transmission signal TRAN_A is activated. In addition, since the second switch 362 is turned off in case that the input data is '1' and the data stored in the cache node QC of the first latch LAT1 is '1', the sensing node SO maintains high level when the first transmission signal TRAN_A is activated. Since the second switch 362 is turned on in case that the input data is '1' and the data stored in the cache node QC of the first latch LAT1 is '0', the potential of the sensing node SO is changed to low level.

TABLE 5

| | Input data | RV | Cache node (first latch) | Main node (second latch) | Flag node (third latch) | Sensing node |
|---|---|---|---|---|---|---|
| case 1 | 0 | 0 | 1 | 0 | 0 | 1 |
| | | 1 | 0 | 0 | 1 | 0 |
| case 2 | 1 | 0 | 1 | 1 | 0 | 1 |
| | | 1 | 0 | 1 | 0 | 0 |

The ground is connected to the data line DL_B0_L. The data stored in the third latch LAT3 is maintained or changed depending on the potential of the sensing node SO when the third reset signal RESET_C is activated. That is, since the potential of the sensing node SO is high level in case that the input data is '0' and the data of the cache node QC is '1', the discharged common node CON is connected to the flag node QF when the third reset signal RESET_C is activated, and the data of the flag node QF is changed from '1' to '0'. Since the potential of the sensing node SO is low level in case that the input data is '0' and the data of the cache node QC is '0', the discharge circuit 390 is deactivated and the flag node QF maintains data '1' though the third reset signal RESET_C is activated. Since the potential of the sensing node SO is high level in case that the input data is '1' and the data of the cache node QC is '1', data '0' is stored in the flag node QF when the third reset signal RESET_C is activated. Since the potential of the sensing node SO is low level in case that the input data is '1' and the data of the cache node QC is '0', data '0' is maintained in the flag node QF though the third reset signal RESET_C is activated.

TABLE 6

| | Input data | RV | Cache node (first latch) | Main node (second latch) | Flag node (third latch) | Sensing node |
|---|---|---|---|---|---|---|
| case 1 | 0 | 0 | 1 | 0 | 0 | 0 |
| | | 1 | 0 | 0 | 1 | 0 |
| case 2 | 1 | 0 | 1 | 1 | 0 | 1 |
| | | 1 | 0 | 1 | 0 | 0 |

The precharge signal PRECH_N is deactivated after the sensing node SO is precharged by activating the precharge signal PRECH_N, and the first transmission signal TRAN_A and the second transmission signal TRAN_B are activated. Accordingly, in case that at least one of the data stored in the cache node QC and the main node QM is '0', the sensing node SO is discharged. Additionally, in case that every data stored in the cache node QC and the main node QM is '1', the potential of the sensing node SO maintains high level.

TABLE 7

| | Input data | RV | Cache node (first latch) | Main node (second latch) | Flag node (third latch) | Sensing node |
|---|---|---|---|---|---|---|
| case 1 | 0 | 0 | 1 | 0 | 0 | 0 |
| | | 1 | 0 | 0 | 1 | 0 |
| case 2 | 1 | 0 | 1 | 1 | 1 | 1 |
| | | 1 | 0 | 1 | 0 | 0 |

The data stored in the third latch LAT3 is maintained or changed depending on the potential of the sensing node SO when the third set signal SET_C is activated. Since the discharge circuit 390 is deactivated in case that the potential of the sensing node SO is low level, the data stored in the third latch LAT3 is maintained. Since the discharge circuit 390 is activated in case that the potential of the sensing node SO is high level, the ground is connected to the data line DL_B0_L and the common node CON, and thus the common node CON is discharged. Accordingly, in case that the third set signal SET_C is activated, the data stored in the third latch LAT3 is changed from '0' to '1'.

Referring to Table 1 to Table 7, it is verified that data generated by performing XOR operation on the input data and the random value data (one of RV<7:0>) is inputted to the third latch LAT3. The program operation is performed by using the data in accordance with XOR operation as program data.

In the copyback operation, data programmed in a target page of a memory block is sensed by a page buffer, the sensed data is amended without being outputted to the outside, and then the amended data is stored in another page of the same memory block or a page of another memory block. In the present invention, data of the target page in which random data is stored is read, the random data is changed to normal data by performing XOR operation on the read data in the page buffer, and then the normal data may be randomized again and programmed in another page of the same memory block or the normal data may be transmitted to a page buffer connected to another memory block. The transmitted normal data may be randomized and programmed by the page buffer. As a result, since the data is randomized again by using the random value data in response to the page address changed in the page buffer though the page address is changed in the copyback operation, malfunction of the semiconductor memory device may not occur.

In the copyback operation and the read operation, the above operation method may read the randomized data by reading the data of the memory cells using the second latch LAT2, reading inverted data from the third latch LAT3, and then providing inverted random signal to the first latch LAT1.

As described above, the input data is stored in the page buffer, the random value data generated from the random value generation circuit is stored in the page buffer, the random data is generated by performing XOR operation on the input data and the random value data using the page buffer, and the generated random data is stored as the program data and then is programmed. Accordingly, the speed of generating the random data may be enhanced compared to the operation of randomizing the input data and storing the randomized input data in the page buffer, the randomization operation may be performed on assigned data in the partial data input operation, and the limitation of the copyback operation may be removed because the randomization operation is performed in the page buffer.

What is claimed is:

1. A semiconductor memory device comprising:
a memory cell block including memory cells;
a random value generation circuit configured to generate random value data using a column address;
a page buffer section connected to bit lines of the memory cell block and configured to store input data and the generated random value data; and
a controller configured to control the page buffer section to generate random data by performing a logic operation on the input data and the random value data stored in the page buffer section.

2. The semiconductor memory device of claim 1, wherein the random value generation circuit includes:
an initial random signal generator configured to generate an initial random signal in response to a page address and the column address;
a seed decoder configured to generate a seed value by decoding the initial random signal; and
a linear feedback shift register configured to generate the random value data in response to a count clock signal and the seed value.

3. The semiconductor memory device of claim 1, wherein the random value data has random characteristics to randomize a word line and a bit line of a memory cell in which the input data is to be stored.

4. The semiconductor memory device of claim 1, wherein the page buffer section includes page buffer groups each having page buffers.

5. The semiconductor memory device of claim 4, wherein the random value data is inputted simultaneously to the page buffer groups.

6. The semiconductor memory device of claim 4, wherein each of the page buffers include latches for storing the input data, the random value data and the random data.

7. A semiconductor memory device comprising:
a memory cell block including memory cells;
a random value generation circuit configured to generate random value data using a column address;
page buffer groups configured to correspond to respective bit line groups of the memory cell block and store input data and the random value data; and
a controller configured to control the page buffer groups to generate random data by performing a logic operation on the input data and the random value data stored in the page buffer groups,
wherein the random value data has random characteristics to randomize a word line and a bit line of a memory cell in which the input data is to be stored.

8. The semiconductor memory device of claim 7, further comprising
a column decoder configured to transmit the input data to the page buffer groups in response to the column address.

9. The semiconductor memory device of claim 7, wherein the random value generation circuit includes:
an initial random signal generator configured to generate an initial random signal to in response to a page address and the column address;
a seed decoder configured to generate a seed value by decoding the initial random signal; and
a linear feedback shift register configured to generate the random value data in response to a count clock signal and the seed value.

10. The semiconductor memory device of claim 7, wherein the page buffer groups include plural page buffers.

11. The semiconductor memory device of claim 10, wherein each of the page buffers includes latches for storing the input data, the random value data and the random data.

12. The semiconductor memory device of claim 7, wherein the random value data is inputted simultaneously to the page buffer groups.

13. A method of operating a semiconductor memory device, the method comprising:
generating random value data in response to a column address;
storing the random value data and input data in each of page buffers connected to the memory cell block;
generating random data by performing a logic operation on the random value data and the input data; and
programming the random data to a memory cell block.

14. The method of claim 13, wherein the each of the page buffers generates the random data by performing XOR operation on the input data and the random value data.

15. The method of claim 13, wherein the random value data is generated in response to the column address and a page address of the input data.

16. A method of operating a semiconductor memory device, the method comprising:
inputting program data to a first latch of a page buffer;
storing the program data inputted to the first latch in a second latch of the page buffer and storing inverted data of the program data inputted to the first latch in a third latch of the page buffer;
storing random value data generated in response to a column address of the program data in the first latch;
performing XOR operation on the program data and the random value data and storing data obtained by the XOR operation in the third latch; and
performing a program operation using the data stored in the third latch.

17. The method of claim 16, wherein the performing of the XOR operation and the storing of the data obtained by the XOR operation includes:
determining potential of a sensing node of the page buffer in response to the random value data stored in the first latch;
determining the inverted data stored in the third latch in response to the potential of the sensing node determined in response to the random value data stored in the first latch;
determining the potential of the sensing node in response to the random value data and the program data stored in the first latch and the second latch; and
determining the data stored in the third latch in response to the potential of the sensing node determined in response to the random value data and the program data stored in the first latch and the second latch.

18. The method of claim 17, further comprising precharging the sensing node before the determining of the potential of the sensing node in response to the random value data stored in the first latch and the determining of the potential of the sensing node in response to the random value data and the program data stored in the first latch and the second latch.

19. The method of claim 17, wherein in the determining of the potential of the sensing node in response to the random value data and the program data stored in the first latch and the second latch,
the sensing node is determined to store data '0' when data '1' is stored in the first latch and the second latch, and the sensing node is determined to maintain data stored therein when data '0' is stored in at least one of the first latch and the second latch.

* * * * *